(12) United States Patent
Chen et al.

(10) Patent No.: US 7,504,721 B2
(45) Date of Patent: Mar. 17, 2009

(54) APPARATUS AND METHODS FOR PACKAGING DIELECTRIC RESONATOR ANTENNAS WITH INTEGRATED CIRCUIT CHIPS

(75) Inventors: Zhi Ning Chen, Singapore (SG); Brian P. Gaucher, Brookfield, CT (US); Duixian Liu, Scarsdale, NY (US); Ullrich R. Pfeiffer, Yorktown Heights, NY (US); Thomas M. Zwick, Kisslegg (DE)

(73) Assignee: International Business Machines Corporation, Armonk, NY (US)

( * ) Notice: Subject to any disclaimer, the term of this patent is extended or adjusted under 35 U.S.C. 154(b) by 375 days.

(21) Appl. No.: 11/334,832

(22) Filed: Jan. 19, 2006

(65) Prior Publication Data
US 2007/0164420 A1    Jul. 19, 2007

(51) Int. Cl.
*H01L 23/34* (2006.01)
(52) U.S. Cl. .................. 257/724; 257/691; 257/728; 257/E23.141; 343/873

(58) Field of Classification Search .............. 257/691, 257/687, 728, 787; 343/700, 873
See application file for complete search history.

(56) References Cited

U.S. PATENT DOCUMENTS

| 3,820,118 | A | * | 6/1974 | Hall ........................ 343/872 |
| 5,453,754 | A | * | 9/1995 | Fray ........................ 343/789 |
| 6,100,804 | A | * | 8/2000 | Brady et al. ............. 340/572.7 |
| 6,147,647 | A | * | 11/2000 | Tassoudji et al. ...... 343/700 MS |
| 2004/0233107 | A1 | * | 11/2004 | Popov et al. .......... 343/700 MS |

* cited by examiner

*Primary Examiner*—Lex Malsawma
*Assistant Examiner*—Robert Huber
(74) *Attorney, Agent, or Firm*—F. Chau & Associates, LLC

(57) ABSTRACT

Apparatus and methods are provided for integrally packaging antenna devices with semiconductor IC (integrated circuit) chips, wherein IC chips are packaged with dielectric resonators antennas that are integrally constructed as part of a package molding (encapsulation) process, for example, to form compact integrated radio/wireless communications systems for millimeter wave applications.

4 Claims, 9 Drawing Sheets

US 7,504,721 B2

APPARATUS AND METHODS FOR PACKAGING DIELECTRIC RESONATOR ANTENNAS WITH INTEGRATED CIRCUIT CHIPS

TECHNICAL FIELD OF THE INVENTION

The present invention generally relates to apparatus and methods for integrally packaging antenna devices with semiconductor IC (integrated circuit) chips and, in particular, apparatus and methods for packaging IC chips with dielectric resonator antennas that are integrally constructed as part of a package molding (encapsulation) process, for example, to thereby form compact integrated radio/wireless communications systems for millimeter wave applications.

BACKGROUND

Technological innovations in wireless systems and devices have lead to widespread development of wireless network applications for wireless PAN (personal area network), wireless LAN (local area network), wireless WAN (wide area network), cellular networks, and other types of wireless communication systems. To enable wireless communication between devices in a wireless network, the devices must be equipped with receivers, transmitters, or transceivers, as well as antennas that can efficiently radiate/receive signals transmitted to/from other devices in the network.

Conventional radio communication systems are typically constructed using discrete components that are individually encapsulated and/or mounted with low integration levels on printed circuit boards, packages or substrates. For example, radio communication systems are typically built using expensive and bulky wave guides and/or package-level or board-level micro strip structures that provide electrical connections between semiconductor chips (RF integrated circuits) and between semiconductor chips and transmitter or receiver antennas.

There is an increasing market demand, however, for more compact radio communication systems with integrated transmitter/receiver/transceiver and antenna systems, which provide high-performance, high data transmission rate, high-volume, low-power consumption, low cost, and low weight solutions. Indeed, current communication systems require high performance antenna systems that provide, e.g., wide bandwidth, high-gain, and high-efficiency operating characteristics. As the operating frequency increases, the manufacture and assembly of conventional waveguide front-ends become more difficult. In this regard, innovations in semiconductor fabrication and packaging technologies, coupled with requirements for higher operating frequencies, have made it practically feasible for integrating antennas with RF integrated circuits to provide highly integrated radio communication systems.

SUMMARY OF THE INVENTION

In general, exemplary embodiments of the invention include apparatus and methods for integrally packaging dielectric resonator antenna devices with semiconductor IC (integrated circuit) chips in compact, chip scale package structures. Exemplary embodiments of the invention more specifically include apparatus and methods for packaging IC chips with dielectric resonators antennas that are integrally constructed as part of a package molding (encapsulation) process, for example, to thereby form compact integrated radio/wireless communications systems for millimeter wave applications.

In one exemplary embodiment of the invention, an electronic package apparatus includes a package frame and an IC (integrated circuit) chip mounted to the package frame. The IC chip has an antenna feed network formed on an active surface thereof. A dielectric resonator antenna is stacked on the active surface of the antenna and aligned to a portion of the feed network. In one embodiment, the dielectric resonator antenna is formed by an injection molding process and is embedded within a dielectric encapsulant material having characteristics (low loss, low dielectric constant) that enhance antenna performance while servings as a package cover.

In another exemplary embodiment of the invention, an electronic package apparatus includes a package substrate and an IC (integrated circuit) chip mounted to a first region of the package substrate. A dielectric resonator antenna stacked on a second region of the package substrate adjacent the first region and a feed network is formed on the package substrate between the first and second regions.

These and other exemplary embodiments, aspects, features and advantages of the present invention will be described or become apparent from the following detailed description of exemplary embodiments, which is to be read in connection with the accompanying drawings.

DETAILED DESCRIPTION OF EXEMPLARY EMBODIMENTS

In general, exemplary embodiments of the invention as described herein include apparatus and methods for integrally packaging dielectric resonator antennas with semiconductor IC (integrated circuit) chips to provide highly-integrated and high-performance radio/wireless communications systems for millimeter wave applications (e.g., voice communication, data communication, etc.). Exemplary embodiments of the invention will be discussed with reference to FIGS. 1-5, for example, which schematically illustrate apparatus and methods for integrally packaging IC chips and dielectric resonator antennas to form compact package structures similar in size to that of existing leaded carriers or leadless chip carriers. The exemplary apparatus and methods described herein can be used to package dielectric resonator antennas together with IC chips having integrated receiver, transmitter or transceiver systems (and other RF circuits) to construct RF or wireless communications chips that operate at millimeter wave frequencies of 20 GHz or greater.

Figure 1:
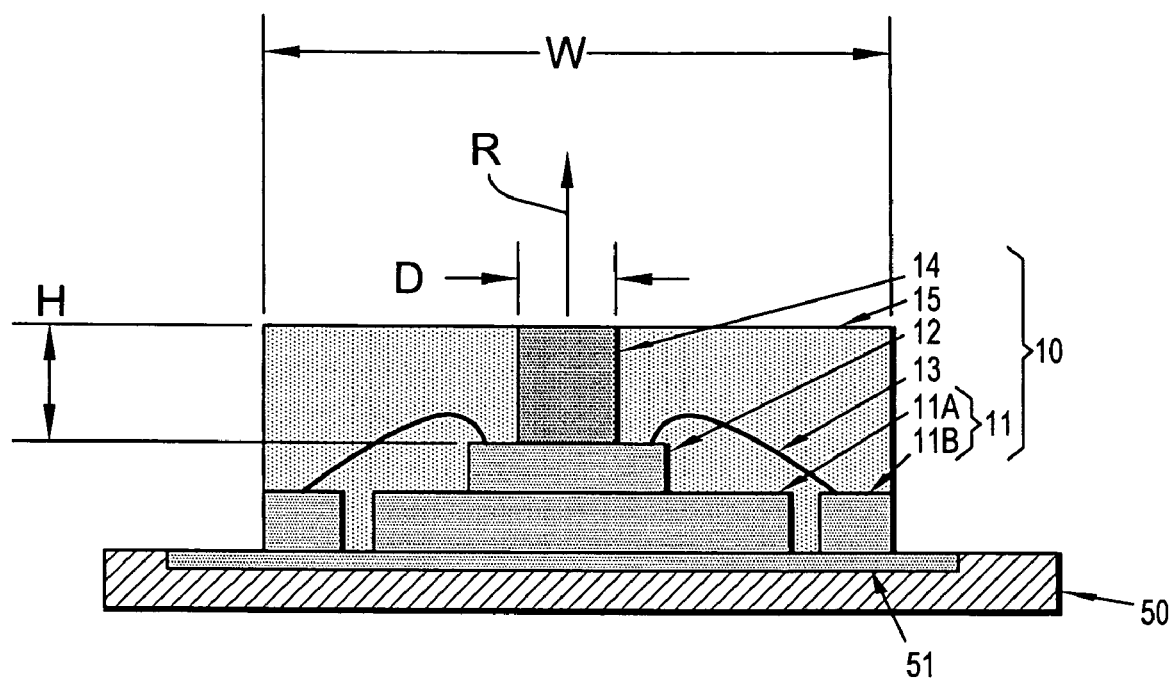
FIG. 1 schematically illustrates an apparatus for packaging a dielectric resonator antenna and IC chip, according to an exemplary embodiment of the present invention.
Figure 2:
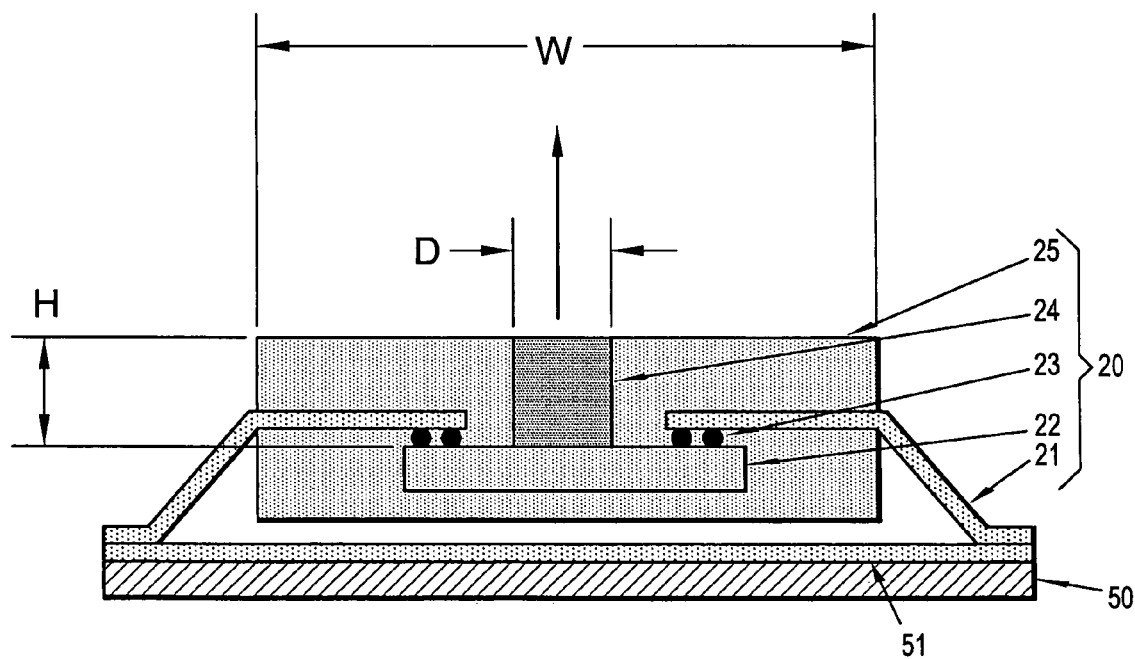
FIG. 2 schematically illustrates an apparatus for packaging a dielectric resonator antenna and IC chip, according to another exemplary embodiment of the present invention.
Figure 3:
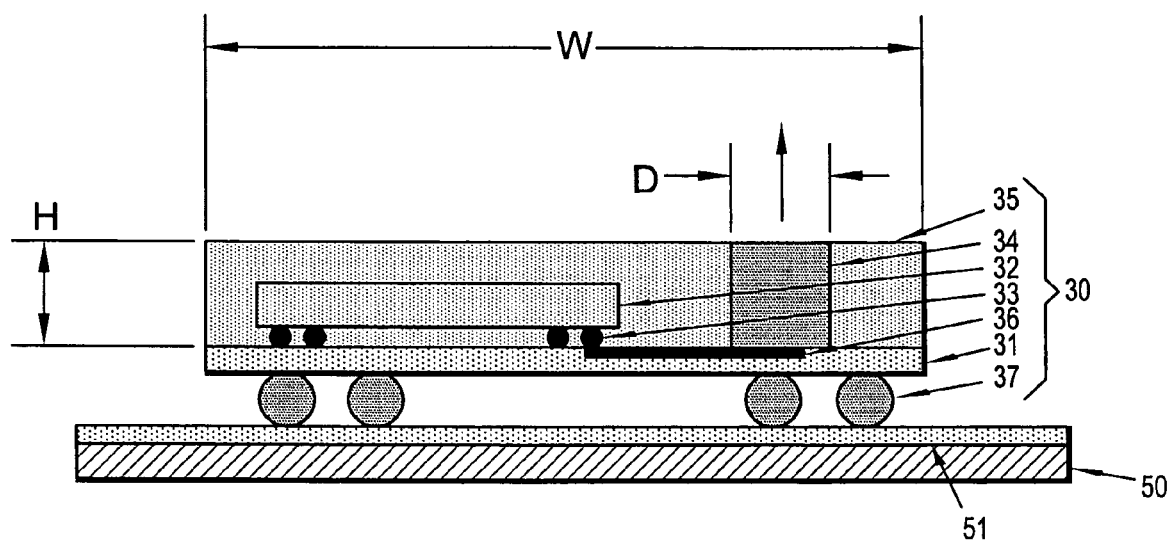
FIG. 3 schematically illustrates an apparatus for packaging a dielectric resonator antenna and IC chip, according to another exemplary embodiment of the present invention.
Figure 4A:
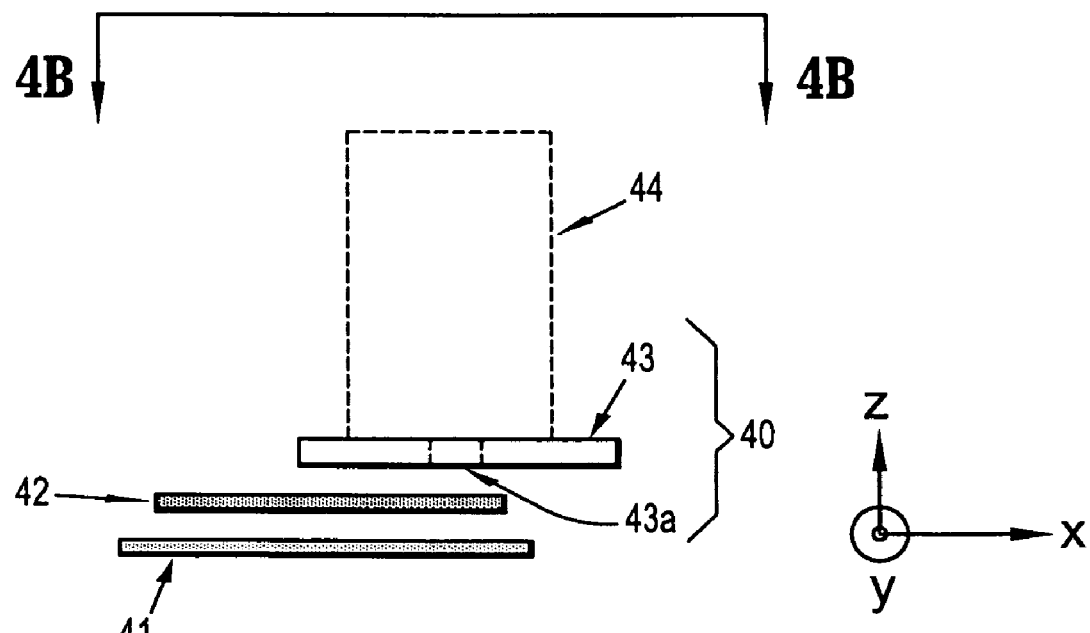
FIGS. 4A and 4B schematically illustrate an apparatus and method for feeding an integrated dielectric resonator antenna according to an exemplary embodiment of the present invention.
Figure 4B:
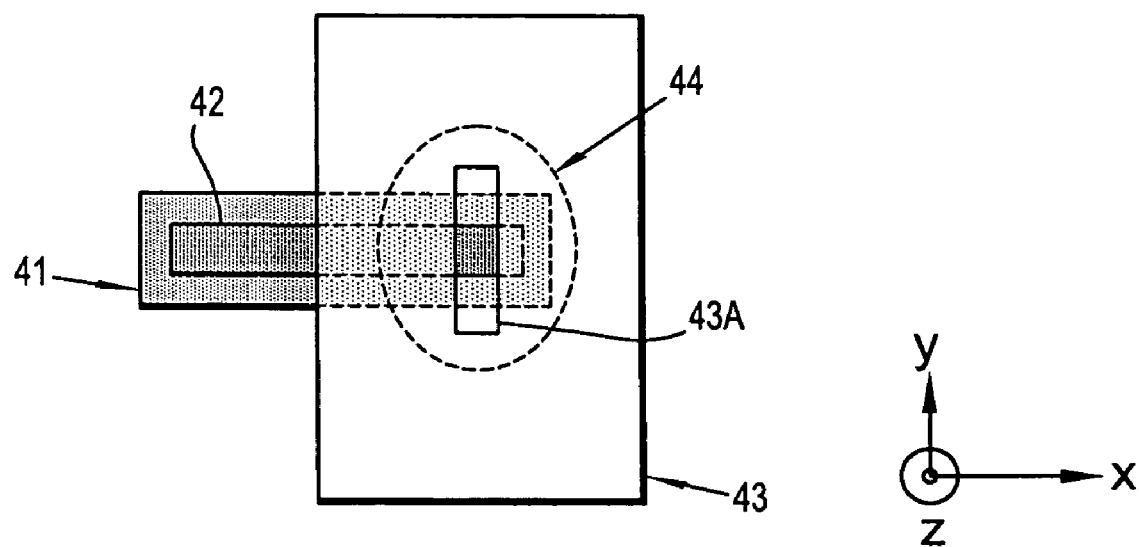
Figure 5:
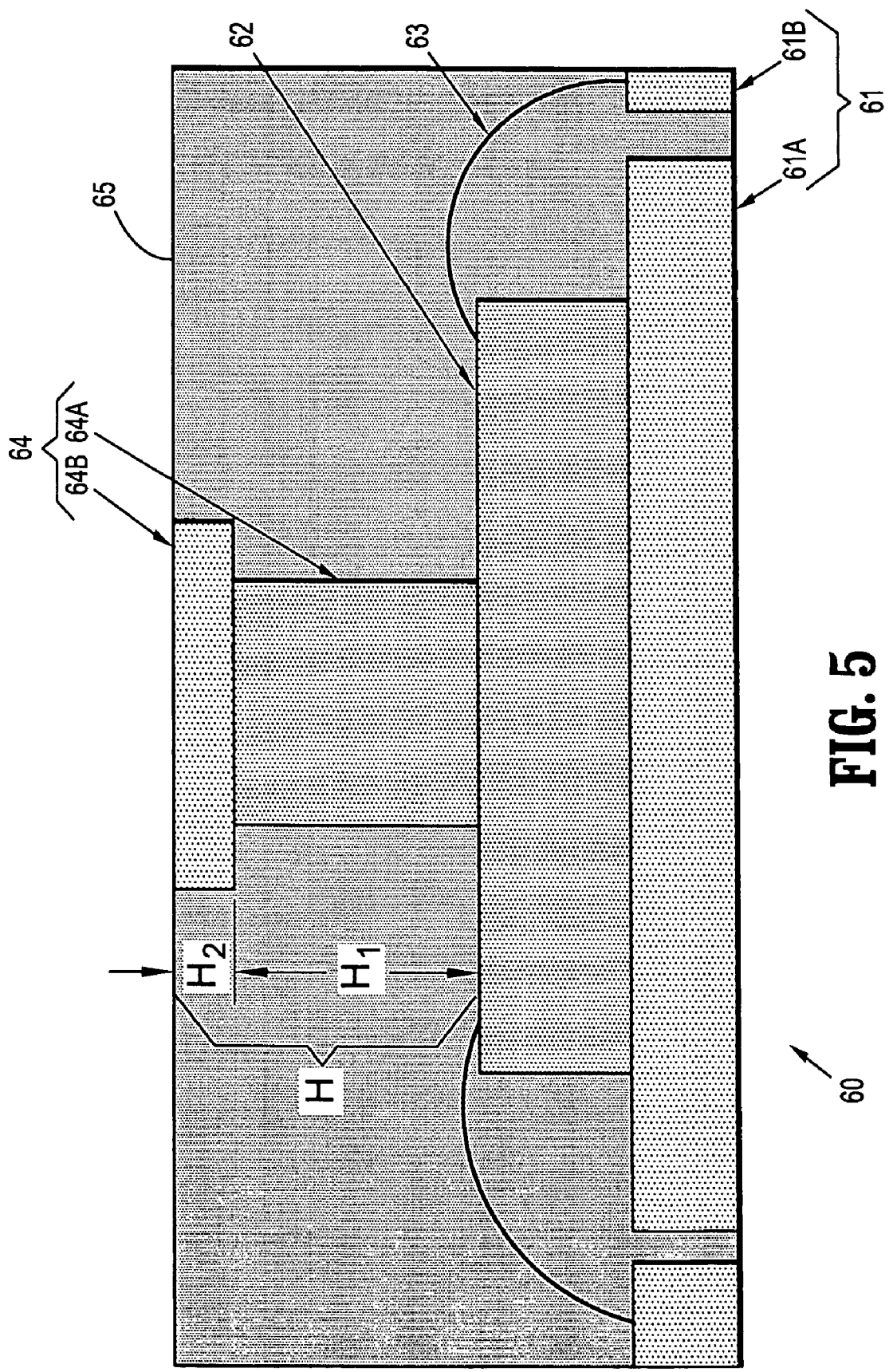
FIG. 5 schematically illustrates an apparatus for packaging a dielectric resonator antenna and IC chip, according to another exemplary embodiment of the present invention.

In general, FIG. 1 illustrates a method for integrally packaging an IC chip and dielectric resonator antenna using a lead-less, QFN (Quad Flat No-lead) semiconductor packaging technology. Further, FIG. 2 illustrates an exemplary method for integrally packaging IC chips and dielectric resonator antennas using flip-chip mounting and leaded packaging technology. In the exemplary embodiments of FIGS. 1 and 2, a dielectric resonator (or core dielectric resonator) is stacked on an IC chip and fed by an on-chip antenna feed network. In another exemplary embodiment, FIG. 3 illustrates a method for packaging an IC chip and dielectric resonator antenna using flip-chip and BGA (ball-grid-array) mounting technologies, wherein an IC chip and core dielectric resonator are mounted on a package substrate or carrier, and an antenna feed network is integrally formed on the substrate or carrier between the IC chip and core dielectric resonator. In yet another embodiment, FIG. 5 schematically illustrates an apparatus and method for packaging a dielectric resonator antenna and IC chip similar to that of FIG. 1, wherein the dielectric resonator antenna comprises a core formed of stacked layers of dielectric materials, according to another exemplary embodiment of the present invention. FIGS. 4A and 4B schematically illustrate an apparatus and method which can be implemented for feeding integrated dielectric resonator antennas in the package structures of FIGS. 1, 2, 3 and 5, according to an exemplary embodiment of the present invention.

More specifically, FIG. 1 schematically illustrates an electronic package apparatus for integrally packaging a dielectric resonator antenna and IC chip, according to an exemplary embodiment of the present invention. Referring to FIG. 1, an integrated chip package (10) comprises a package frame (11), IC chip (12), wire bonds (13), a dielectric resonator (14) and package encapsulant (15). As explained further below, in the exemplary embodiment of FIG. 1, a dielectric resonator antenna (DRA) is essentially formed by a combination of the dielectric resonator (14) (or core dielectric resonator) and the package encapsulant (15) (or dielectric shell), where the core dielectric resonator (14) is designed to resonate at a fundamental frequency of operation and wherein the encapsulant (15) is a dielectric shell material having electrical properties (e.g., dielectric constant) that are selected to obtain electrical characteristics of the integrated DRA (e.g., wide bandwidth, etc.).

In the exemplary embodiment of FIG. 1, the package frame (11) is a lead-less frame structure that can be fabricated using QFN (Quad Flat No-lead) semiconductor, packaging technology. The package frame (11) comprises a die paddle (11A) and a plurality of lead elements (11B). The IC chip (12) (or die) is backside mounted to a surface of the die paddle (11A) using bonding material (e.g., solder, epoxy, etc.). The wire bonds (13) form electrical connections between I/O pads on the active surface of the chip (12) and the package leads (11B). The package (10) is mounted on a printed circuit board (PCB) (50) using surface mount technology, wherein the package (10) is electrically connected to the PCB (50) by soldering the non-protruding pads (11B) on the bottom side of the package body to appropriate bond pads (51) on the surface of the PCB (50).

The dielectric resonator (14) is stacked over the active surface of the chip (12) and aligned to an antenna feed network that is integrally formed as part of the BEOL (back-end-of-line) metallization on the chip (12). The antenna feed network may be an on-chip slot (aperture) (such as depicted in the exemplary embodiment of FIGS. 4A and 4B, to be discussed below), although other suitable types of antenna feeds may be used such as micro-strip line, CPW (coplanar wave guide), wire probe (monopole) or micro-strip patch, for example.

The dielectric resonator (14) will have a discrete spectrum of self-frequencies and self-modes depending on the shape of the dielectric resonator (14) and the material used to form the dielectric resonator (14). In particular, the dielectric resonator (14) will have different modes of operation and radiation characteristics depending on the physical geometry of the dielectric, e.g. cylindrical, spherical or rectangular. In one exemplary embodiment of the invention, the core dielectric resonator (14) is cylindrical-shaped having a diameter (D) and height (H) and formed of a material having a dielectric constant, $\in_{r\_Core}$. The core dielectric resonator (14) may be formed of ceramics or other low loss dielectric material, mold materials such as thermosetting or UV-activated composite epoxy resins containing various dielectric filler materials, or other plastic injection molding materials like thermoplastic resins or polymers.

The package encapsulation (15) (or dielectric shell) surrounds the side surfaces of the core dielectric resonator (14). In the exemplary embodiment of FIG. 1, the package encapsulant (15) is designed for several purposes. For one, the encapsulant (15) protects and insulates the chip and wire bonds from the environment. Moreover, as noted above the encapsulant (15) serves as a dielectric shell that surrounds the core dielectric resonator (14). In other words, in the exemplary embodiment of FIG. 1, a dielectric resonator antenna (DRA) is essentially formed by a combination of the core dielectric resonator (14) and dielectric shell provided by the package encapsulant (15). The package encapsulant (15) may be formed of any suitable mold material such as thermosetting or UV-activated composite epoxy resins.

In the exemplary embodiment of FIG. 1, the core dielectric resonator (14) is formed of a first material having a first dielectric constant, $\in_{r\_Core}$, and the package encapsulant (15) is formed of a mold material having a second dielectric constant, $\in_{r\_Shell}$, wherein the dielectric constant of the core material is greater than the dielectric constant of the shell material, i.e., $\in_{r\_Core} > \in_{r\_Shell}$.

It is to be appreciated that use of a dielectric resonator antenna for chip-scale integration provides various advantages. For example, a DRA does not use conducting structures as radiating elements and does not exhibit losses due to the skin effect as with metallic elements. Therefore, such antennas have low-ohmic losses at high frequencies. Furthermore, by using dielectric materials with a very high dielectric constant to form the core dielectric resonator (14) a compact, antenna structure can be realized on the level of chip scale packaging. For instance, as discussed in further detail below, in the exemplary embodiment of FIG. 1, for an operating frequency in the 60 GHz range, the height (H) of the core dielectric resonator (14) can be in a range of about 1-2 mm and the diameter (D) can be around 2 mm. With such small dimensions of the core dielectric resonator (14), the integrated chip package (10) is compact and can be formed having a width, W, in a range of about 5-20 mm.

It is to be understood that the package structure (10) of FIG. 1 can be formed using conventional chip packaging methods. For instance, in one exemplary embodiment of the invention, the dielectric resonator (14) and package encapsulation (15) can be formed by separate injection molding processes during a package molding (encapsulation) process. In particular, an exemplary method for fabricating the package (10) is as follows. An initial step of the exemplary packaging method includes constructing the lead frame structure (11) by patterning a metallic substrate to form, e.g. the die paddle (11A), lead elements (11b), etc. The lead-frame structure (11) can be fabricated from a thin metallic sheet or metallic plate that is formed of metallic material such as, e.g., copper (Cu), a Cu-based alloy or other suitable conductor materials, and patterned by etching, stamping or punching the metallic plate using known methods.

After the lead frame (11) is constructed, the exemplary packaging method proceeds with a chip mounting process and wire bonding process to mount the IC chip (12) to the die paddle (11A) using any suitable bonding material placed between the bottom (non active) surface of the chip (12) and the surface of the die-paddle (11A). Thereafter, electrical connections can be made by forming various bond wires (13) including, e.g., bond wires (13) that make connections from the IC chip (12) to the lead elements (11B).

A next step in the exemplary packaging method includes a molding process to form the core dielectric resonator (14) and the package encapsulation (15). In one exemplary embodiment, the molding process may include a first injection molding process to form the package encapsulant (15) using dielectric material such as thermosetting or UV-activated composite epoxy resins or thermoplastic resins or polymers. In this step, a filler structure (e.g., metal rod) can be placed at the location of the DRA core and encapsulated during the first mold process. Thereafter, the filler structure can be removed, and the core dielectric resonator (14) can be formed using a second injection molding process to fill the opening using a dielectric material such as thermosetting or UV-activated composite epoxy resins with appropriate fillers.

In another exemplary embodiment of the invention, the core dielectric resonator (14) can be formed of a solid dielectric material (such as ceramic or other low loss high dielectric constant material) that is first mounted to the IC chip (12) and then encapsulated by the package encapsulant (15) together with the other package components during a package molding process. In such instance, one injection molding process is performed to form the package encapsulant (15). This fabrication process may be used in circumstances where it is desirable to use certain dielectric materials that cannot be used in an injection molding process.

Moreover, it may be desirable to mount a separate core dielectric resonator (14) to the chip to enable more precise alignment of the core dielectric resonator (14) to an antenna feed (e.g., on-chip slot (aperture) feed). Indeed, higher antenna efficiency will be achieved with proper impedance matching of the dielectric resonator (14) and antenna feed. This matching depends significantly on the position of the dielectric resonator (14) relative to the feed. When using injection molding to form the core dielectric resonator (14), there can be a random deviation in the relative position of the feed and core dielectric resonator, as a result of the automated molding process. Therefore, in one embodiment of the invention, the core dielectric resonator (14) could be mounted on the chip in a separate step before encapsulation. The package mold material (15) would therefore represent the material with a lower dielectric constant surrounding the core of the resonator.

FIG. 2 schematically illustrates an electronic package apparatus for integrally packaging a dielectric resonator antenna and IC chip, according to an exemplary embodiment of the present invention. FIG. 2 illustrates a method for integrally packaging an IC chip and dielectric resonator antenna using flip-chip mounting and leaded packaging technology. Referring to FIG. 2, an integrated chip package (20) comprises a leaded package structure comprising package leads (21), an IC chip (22), solder ball bonds (23), a core dielectric resonator (24) and a package encapsulant (25). In the exemplary embodiment of FIG. 2, the package leads (21) are connected to I/O pads on the active surface of the chip (22) by the solder ball connections (23). Essentially, FIG. 2 depicts an exemplary embodiment of a package integrated DRA using flip-chip mounting technology inside a leaded package structure, wherein a DRA feed is integrated on chip. The package (20) is electrically connected to a PCB (50) by soldering the leads (21) to appropriate bond pads (51) on the surface of the PCB (50).

As with the exemplary embodiment of FIG. 1, the core dielectric resonator (24) is stacked over the active surface of the chip (22) and aligned to an antenna feed network that is integrally formed as part of the BEOL (back-end-of-line) metallization on the chip (22). The antenna feed may be an on-chip slot (aperture), micro-strip line, CPW (coplanar wave guide), wire probe (mono-pole) or micro-strip patch, for example. The package encapsulation (25) is formed to surround the side surfaces of the dielectric resonator (24) to enable more efficient radiation. An integrated dielectric resonator antenna (DRA) is essentially formed by the core dielectric resonator (24), in combination with a surrounding dielectric shell provided by the package encapsulant (25).

The exemplary package (20) can be fabricated using known leaded packaging methods. Furthermore, as discussed above, the core dielectric resonator (24) can be separately formed by injection molding during a package molding process, or can be separate structures that are manually mounted to the surface of the IC chip (22) to obtain more precise alignment to an on-chip antenna feed.

FIG. 3 schematically illustrates an electronic package apparatus (30) for integrally packaging a dielectric resonator antenna and IC chip, according to an exemplary embodiment of the present invention. FIG. 3 illustrates a method for packaging an IC chip and dielectric resonator antenna using flip-chip and BGA (ball-grid-array) mounting technologies. In FIG. 3, an exemplary electronic package apparatus (30) comprises a package frame (31) (or carrier substrate), IC chip (32), solder ball connectors (33), core dielectric resonator (34), package encapsulation (35), antenna feed network (36) and large solder ball connectors (37).

The package frame (31) may be any one of common structures, including, but not limited, laminate substrates (FR-4, FR-5, BTTM and others), buildup substrates (thin organic buildup layers or thin film dielectrics on a laminate or copper core), ceramic substrates (alumina), HiTCETM ceramic, glass substrates with BCBTM dielectric layers, lead-frame structures, semiconductor carriers, etc, which can be fabricated to include metal wiring and bond pads, etc. The package substrate (31) is mounted to bond pads/sites (51) of a PCB (50) via large solder balls (37) using BGA (ball-grid-array) mounting technology.

The IC chip (32) is depicted as being flip-chip bonded via solder ball connectors (33) to a first region of the carrier substrate (31) and the core dielectric resonator (34) is disposed over a second region of the carrier substrate (31). The antenna feed network (36) is integrally formed on the carrier substrate (31) between the IC chip (32) and the core dielectric resonator (34). The antenna feed (36) may be an on-chip slot (aperture), micro-strip line, CPW (coplanar wave guide), wire probe (mono-pole) or micro-strip patch, for example.

As with the exemplary embodiments of FIGS. 1 and 2, the package encapsulation (35) is formed to surround the side surfaces of the core dielectric resonator (34) to enable more efficient radiation. An integrated dielectric resonator antenna (DRA) is essentially formed by the core dielectric resonator (34), in combination with a surrounding dielectric shell provided by the package encapsulant (35).

The exemplary package (30) can be fabricated using known packaging methods. Furthermore, as discussed above, the core dielectric resonator (34) can be separately formed by injection molding during a package molding process, or can be a separate structure that is manually mounted to the surface of the carrier substrate (31) to obtain more precise alignment to the on-chip antenna feed (36).

FIGS. 4A and 4B illustrate an antenna feed network according to an exemplary embodiment of the invention. In particular, FIGS. 4A and 4B illustrate an on-chip slot (Aperture Coupled) feed that can be implemented in the exemplary embodiments of FIGS. 1~3 for feeding power to the core dielectric resonator. FIG. 4A schematically illustrates a side-view of an exemplary antenna feed structure (40), which can be fabricated as part of the BEOL metallization of an IC chip, and FIG. 4B illustrates a top view of the antenna feed structure (40) along line 4B-4B of FIG. 4A. In the exemplary illustrations, a cylindrical dielectric resonator (44) is shown in phantom.

Referring to FIG. 4A, the exemplary antenna feed (40) comprises a stacked structure including a micro strip ground plane (41), a micro strip line (42) and metal shield (43) comprising a slot (43A). The micro strip ground (41), micro strip line (42) and metal shield (43) are formed from 3 upper metal layers of a BEOL process, for example. As depicted in FIG. 4B, the slot (43A) in the metal shield (43) is aligned to a center region of a bottom surface of the dielectric resonator (44), and longitudinally extends perpendicular to the micro strip structure (41, 42).

The exemplary embodiments of FIGS. 1~3 illustrate an integrated DRA formed by a core dielectric resonator embedded/surrounded by the package encapsulant, which provides a dielectric shell formed of material to achieve desired antenna characteristics. It is to be understood, however, that such embodiments are merely exemplary, and that other electronic package structures can be formed for packaging DRA antennas and IC chips. For instance, a package structure can be constructed whereby a core dielectric resonator is mounted on a chip or substrate and a package lid or cover is formed to hermetically seal the package components. With such embodiment, the core dielectric resonator would be surrounded by air or vacuum (or by a low dielectric constant foam), as opposed to being embedded within encapsulation mold material as in the exemplary package structures of FIGS. 1~3.

FIG. 5 schematically illustrates an apparatus for packaging a dielectric resonator antenna and IC chip, according to another exemplary embodiment of the present invention. Referring to FIG. 5, an integrated chip package (60) comprises a package frame (61) (with mounting paddle 61A and leads (61B)), IC chip (62), wire bonds (63), and package encapsulant (65), similar to the exemplary package structure (10) of FIG. 1. However, in the exemplary embodiment of FIG. 5, a dielectric resonator antenna (DRA) (64) is a stacked structure comprising a first core dielectric layer (64A) and a second core dielectric layer (64B). In the exemplary embodiment of FIG. 5, the first dielectric layer (64A) is formed of a first material having a first dielectric constant, $\in_{r\_Core1}$, and the second dielectric layer (64B) is formed of a second material having a second dielectric constant, $\in_{r\_Core2}$, and the package encapsulant (65) is formed of a mold material having a third dielectric constant, $\in_{r\_Shell}$. In one exemplary embodiment, the dielectric constants of the core and shell materials are selected such that $\in_{r\_Core2} > \in_{r\_Core1} > \in_{r\_Shell}$. Moreover, the height H of the core resonator (64) is the total of H2+H1, where H2 is preferably less than H1. The use of the second capping layer (64b) with varied height, width and dielectric properties provides a mechanism for enhancing the antenna performance (e.g., higher bandwidth).

For purposes of determining electrical properties and characteristics of an integrated dielectric resonator antenna design according to the invention, computer simulations were performed using the commercially available 3D EM simulation software tool for RF, wireless, packaging, and optoelectronic design. For the simulation, a computer model was generated for a dielectric resonator antenna with a height (H) of 1350 μm and a diameter (D) of 2000 μm with the dielectric resonator mounted on a package substrate or carrier (e.g., FIG. 3) and fed by a rectangular slot (aperture coupled) feed (FIGS. 4A, 4B). The core dielectric resonator material was defined to have a dielectric constant $\in_{r\_Core}=10$ and the package encapsulant (shell) material was defined to have a dielectric constant $\in_{r\_Mold}=1$. Further, the spacing between the micro strip line and slot was defined to be 90 μm. The dielectric constant of the chip substrate was defined to be $\in_{r\_Substrate}=11.8$.

Figure 6:
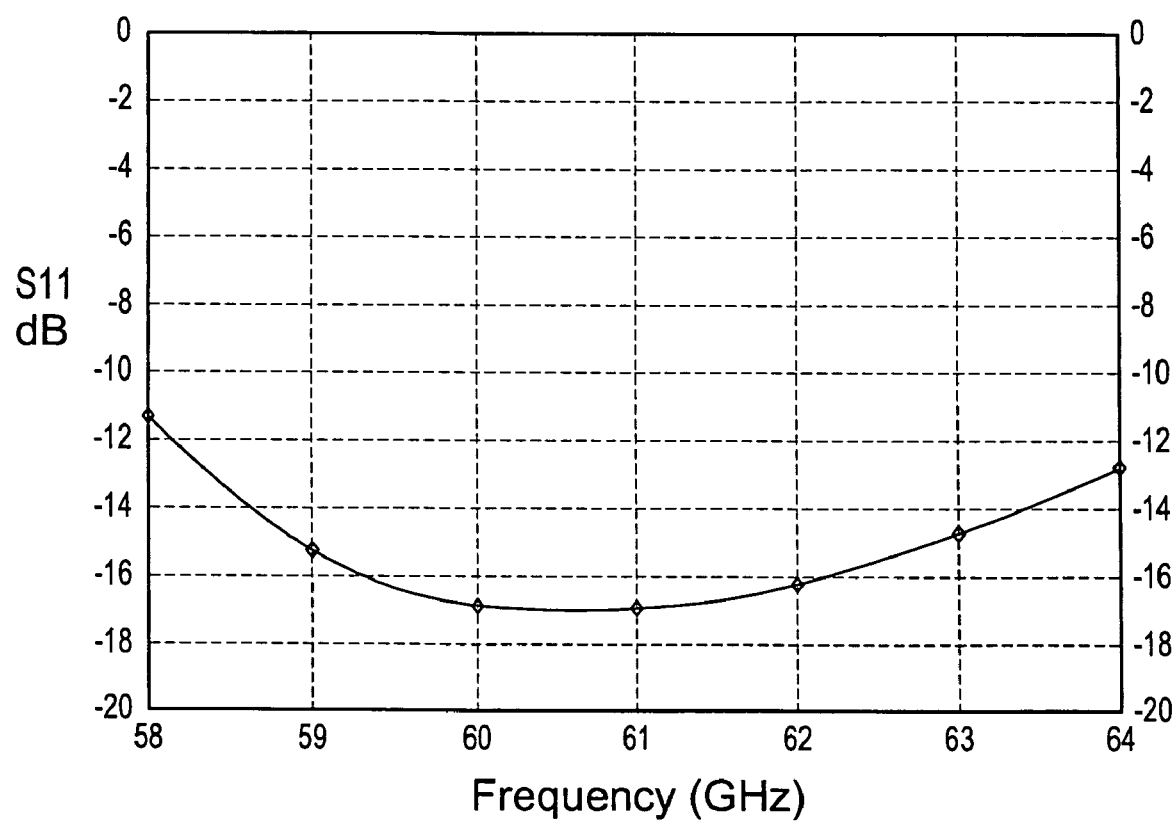
FIG. 6 is graphical diagram illustrating the simulated return loss of a computer-modeled integrated dielectric resonator antenna according to an exemplary embodiment of the invention.
Figure 7:
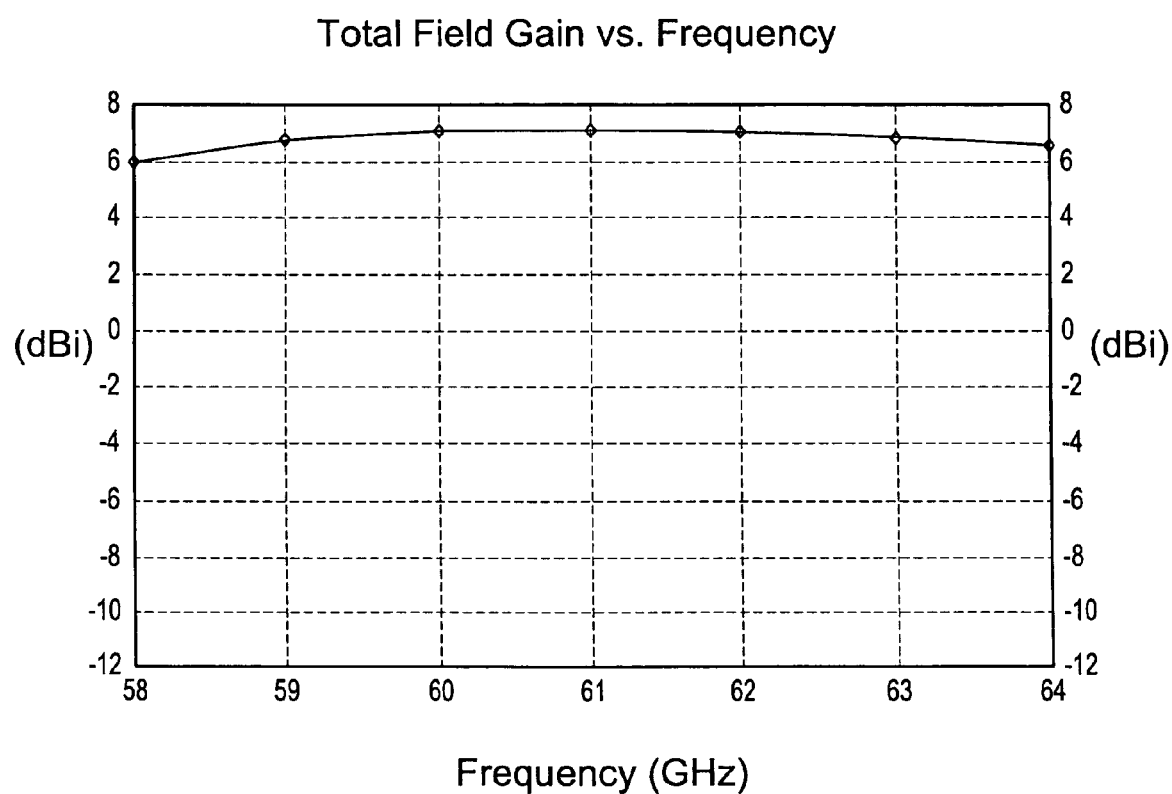
FIG. 7 is graphical diagram illustrating a simulated maximum gain of a computer-modeled integrated dielectric resonator antenna according to an exemplary embodiment of the invention.
Figure 8:
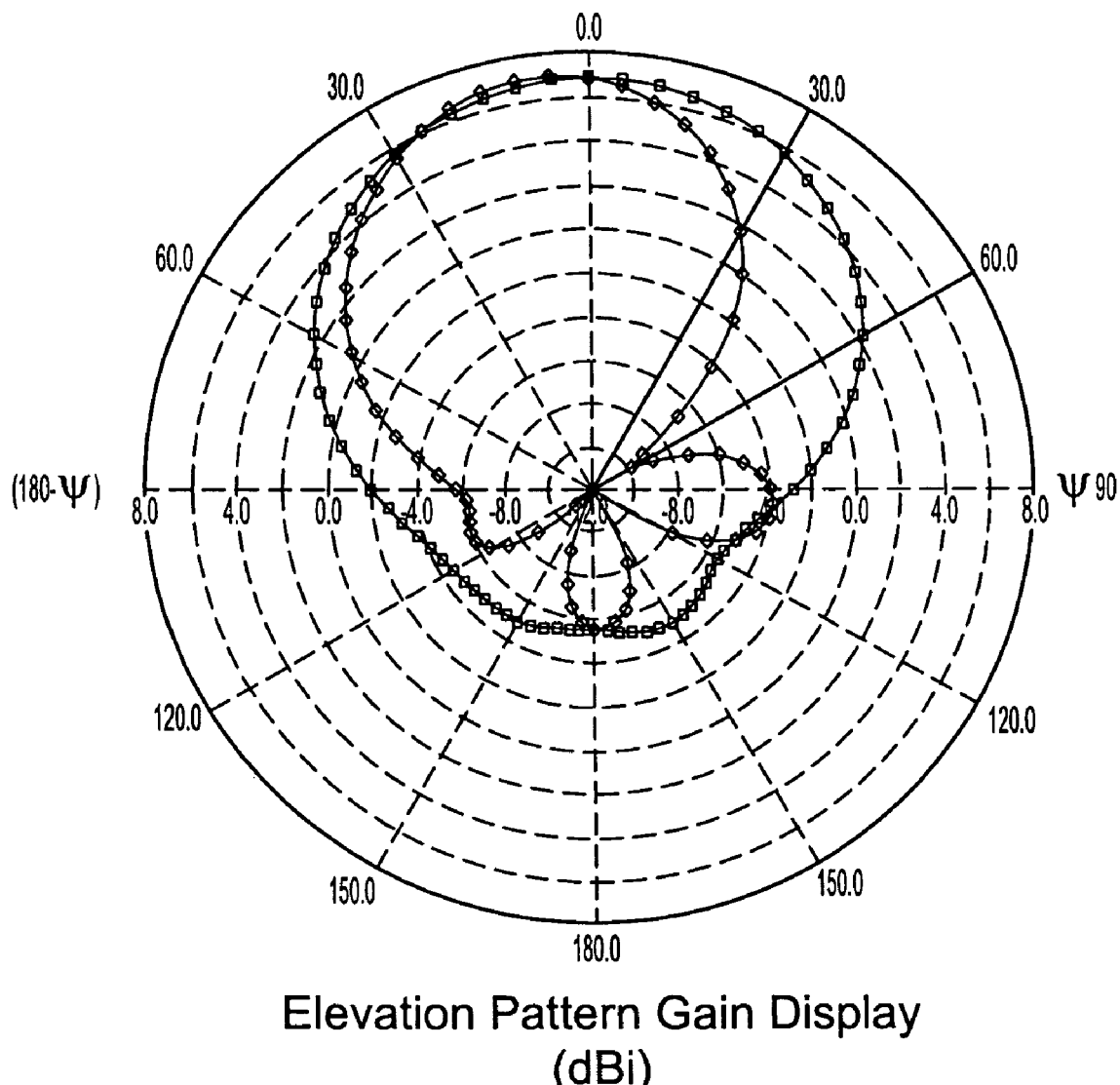
FIG. 8 is a polar diagram illustrating simulated vertical radiation patterns of a computer-modeled integrated dielectric resonator antenna according to an exemplary embodiment of the invention.

The simulation results for the above described simulation are depicted in FIGS. 6, 7 and 8. In particular, FIG. 6 graphically illustrates a simulated return loss of the model antenna and, in particular, the simulated return loss (S11) in dB for a frequency range of 58-64 GHz. The simulation results in FIG. 6 show a center frequency of 61 GHz and a wide bandwidth of at least 8 GHz (58 GHz -64 GHz), wherein bandwidth is defined based on the frequency range for which $S_{11}$ was measured to be about −10 dB or better.

FIG. 7 graphically illustrates a simulated maximum gain of the model antenna and, in particular, the gain (in dBi) over the frequency range of 58-64 GHz. As depicted in FIG. 7, there is a gain of 7 dBi at the resonant frequency of 61 GHZ.

Moreover, FIG. 8 illustrates the simulated vertical radiation patterns of the simulated antenna. The radiation patterns depicted in FIG. 8 assume a Cartesian coordinate system as shown in FIGS. 4A and 4B, wherein the Z-axis extends in a direction along the longitudinal axis of the dielectric resonator (44) and perpendicular to the plane of the substrate (with positive Z direction above the substrate), wherein the y-axis extends along the plane of the substrate in a direction perpendicular to micro strip feed line (40), and wherein the x-axis extends along the plane of the substrate in a direction along the micro-strip feed line (40). FIG. 8 depicts the simulated vertical radiation patterns in polar coordinates for vertical planes defined by the YZ plane (phi=90 degrees) and the XZ plane (phi=0 degrees) wherein 0 degrees represents the positive z direction and 180 degrees represents the negative z direction In FIG. 8, it is shown that there is minimal radiation in the negative z direction and that the energy is focused in the desired positive z direction.

Figure 9:
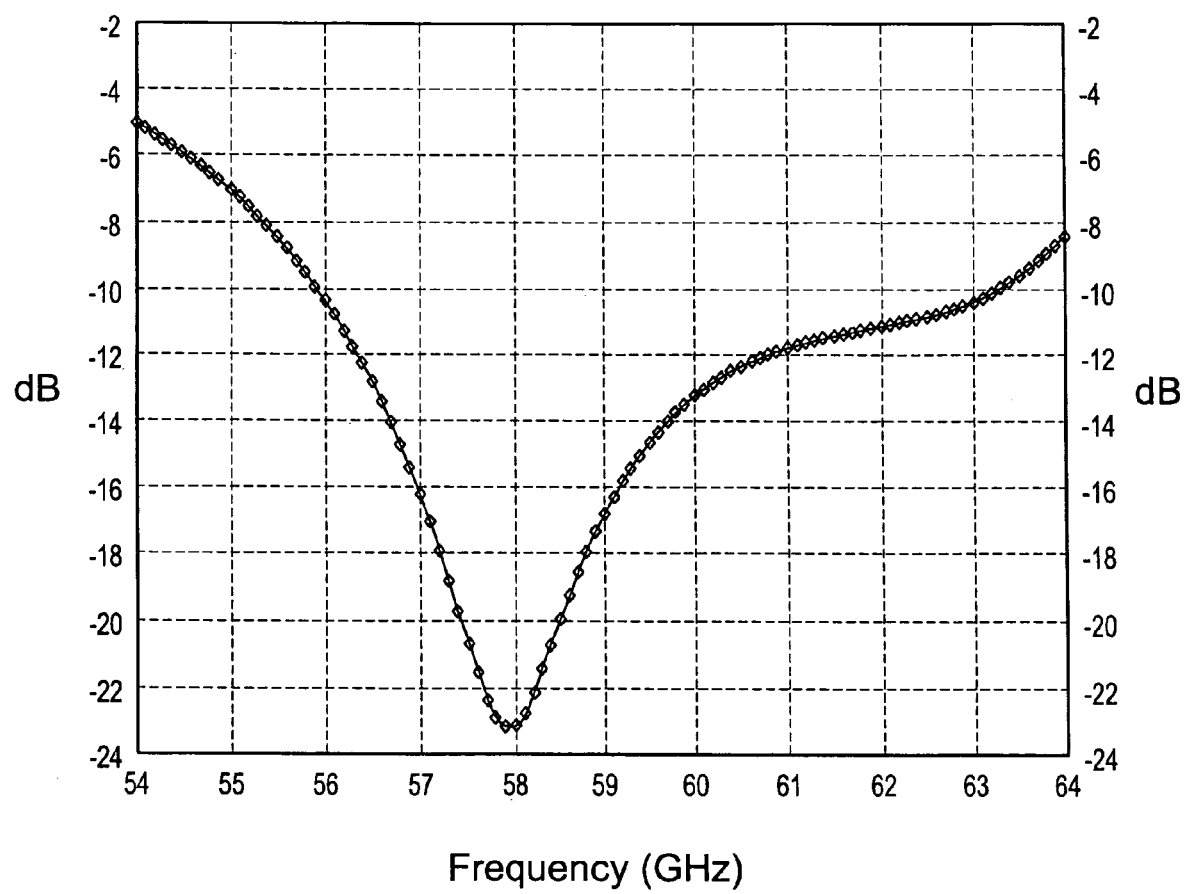
FIG. 9 is graphical diagram illustrating the simulated return loss of another computer-modeled integrated dielectric resonator antenna according to an exemplary embodiment of the invention.

Another simulation was performed with the same parameters listed above, except that the dielectric constant of the encapsulation material was increased to $\in_{r\_Mold}=2.7$. FIG. 9 graphically illustrates a simulated return loss of the model antenna and, in particular, the simulated return loss (S11) in dB for a frequency range of 54-64 GHz. The simulation results in FIG. 9 show a center frequency of about 58 GHz and a wide bandwidth of at least 7-8 GHz (56 GHz-63 GHz), wherein the bandwidth is defined based on the frequency range for which $S_{11}$ was measured to be about −10 dB or better.

The simulation results demonstrate that dielectric resonator antennas can be readily integrated (e.g. molded) with active circuitry of IC chips to form compact, radio communication systems at chip-scale packaging levels, which can efficiently operate at millimeter wave frequencies.

Those of ordinary skill in the art will readily appreciate the various advantages associated with integrated chip/antenna package structures according to embodiments of the invention. For instance, the exemplary package structure can be readily fabricated using known techniques to enable high-volume antenna manufacturing capability. Moreover, integrated chip packages according to exemplary embodiments of the invention enable dielectric resonator antennas to be integrally packaged with IC chips such as transceiver chips, which provide compact designs with very low loss between the transceiver and the antenna. Moreover, the use of integrated antenna/IC chip packages according to the present invention saves significant space, size, cost and weight, which is a premium for virtually any commercial or military application.

Although exemplary embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. An electronic package apparatus, comprising:

a package frame;

an IC (integrated circuit) chip mounted to a die paddle of the package frame, the IC chip having an antenna feed network formed on an active surface thereof electrically connecting the IC chip to package leads of the package frame;

a dielectric resonator antenna stacked on the active surface of the IC chip and aligned to a portion of the feed network; and a package cover formed over the IC chip and the dielectric resonator antenna, wherein the dielectric resonator antenna has one surface that is exposed through the package cover, and wherein a portion of the package cover is disposed between the die paddle and the package leads.

2. The apparatus of claim 1, wherein the dielectric resonator antenna is formed by injection molding using a first dielectric material.

3. The apparatus of claim 2, wherein the package cover is an encapsulation material that is formed by injection molding using a second dielectric material, wherein the second dielectric material surrounds the first dielectric material.

4. The apparatus of claim 3, wherein the first dielectric material has a first dielectric constant and the second dielectric material has a second dielectric constant, wherein the first dielectric constant is greater than the second dielectric constant.

* * * * *